US010199003B2

(12) United States Patent
Wang (10) Patent No.: US 10,199,003 B2
(45) Date of Patent: Feb. 5, 2019

(54) GATE DRIVING UNIT AND DRIVING METHOD THEREOF, GATE DRIVING CIRCUIT AND DISPLAY DEVICE (71) Applicants: BOE TECHNOLOGY GROUP CO., LTD., Beijing (CN); BEIJING BOE DISPLAY TECHNOLOGY CO., LTD., Beijing (CN)

(72) Inventor: Zheng Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 198 days.

(21) Appl. No.: 15/159,116

(22) Filed: May 19, 2016

(65) Prior Publication Data
US 2017/0011699 A1 Jan. 12, 2017

(30) Foreign Application Priority Data

Jul. 7, 2015 (CN) .......................... 2015 1 0394111

(51) Int. Cl.
*G11C 19/00* (2006.01)
*G09G 3/36* (2006.01)
*G11C 19/28* (2006.01)

(52) U.S. Cl.
CPC .......... *G09G 3/3677* (2013.01); *G11C 19/28* (2013.01); *G09G 2310/0286* (2013.01); *G09G 2310/0291* (2013.01)

(58) Field of Classification Search
None
See application file for complete search history.

(56) References Cited

U.S. PATENT DOCUMENTS

| 7,804,553 B2 * | 9/2010 | Chang | G02F 1/1368 |
| | | | 345/100 |
| 7,932,887 B2 * | 4/2011 | Kim | G09G 3/3677 |
| | | | 345/100 |
| 8,306,177 B2 * | 11/2012 | Lee | G09G 3/3677 |
| | | | 377/64 |

(Continued)

FOREIGN PATENT DOCUMENTS

| CN | 101644867 A | 2/2010 |
| CN | 101950545 A | 1/2011 |

(Continued)

OTHER PUBLICATIONS

First Office Action dated Dec. 8, 2016 in corresponding Chinese Application No. 201510394111.X.

*Primary Examiner* — Tuan T Lam
(74) *Attorney, Agent, or Firm* — Nath, Goldberg & Meyer; Joshua B. Goldberg; Daniel Bissing (57) ABSTRACT The present disclosure relates to a gate driving unit and a driving method thereof, a gate driving circuit and a display device. The gate driving unit used for providing a gate driving signal for a gate line comprises a driving signal output unit and an output compensation unit. The driving signal output unit and the output compensation unit are respectively connected to two input terminals of a load. The output compensation unit is configured to compensate for level jumping of a gate driving signal outputted from the driving signal output unit.

12 Claims, 4 Drawing Sheets

(56) References Cited

U.S. PATENT DOCUMENTS

| | | | | |
|---|---|---|---|---|
| 8,519,934 B2* | 8/2013 | Huang | | G09G 3/3677 345/100 |
| 8,970,572 B2 | 3/2015 | Kim et al. | | |
| 2006/0092109 A1* | 5/2006 | Hsu | | G09G 3/3648 345/87 |
| 2008/0042950 A1* | 2/2008 | Park | | G09G 3/3677 345/87 |
| 2008/0136806 A1* | 6/2008 | Lee | | G09G 3/3688 345/212 |
| 2008/0309597 A1* | 12/2008 | Nam | | G09G 3/3677 345/87 |
| 2009/0128533 A1* | 5/2009 | Tsubata | | G02F 1/13624 345/209 |
| 2010/0109995 A1* | 5/2010 | Fang | | G09G 3/3677 345/100 |
| 2010/0245301 A1* | 9/2010 | Shang | | G09G 3/3677 345/204 |
| 2011/0058640 A1* | 3/2011 | Shang | | G11C 19/184 377/64 |
| 2012/0154361 A1* | 6/2012 | Wu | | G09G 3/3677 345/211 |
| 2013/0135273 A1* | 5/2013 | Lee | | G09G 3/3688 345/211 |
| 2015/0002503 A1* | 1/2015 | Park | | G09G 3/3696 345/212 |
| 2015/0339999 A1* | 11/2015 | Zheng | | G11C 19/28 345/92 |
| 2016/0275834 A1* | 9/2016 | Wang | | G11C 19/28 |
| 2016/0293091 A1* | 10/2016 | Wang | | G09G 3/36 |

FOREIGN PATENT DOCUMENTS

| | | |
|---|---|---|
| CN | 104361869 A | 2/2015 |
| CN | 104392685 A | 3/2015 |
| CN | 104658505 A | 5/2015 |

* cited by examiner

GATE DRIVING UNIT AND DRIVING METHOD THEREOF, GATE DRIVING CIRCUIT AND DISPLAY DEVICE

CROSS-REFERENCE TO RELATED APPLICATION

This application claims priority to Chinese Patent Application No. 201510394111.X, filed on Jul. 7, 2015, the contents of which are incorporated by reference in the entirety.

FIELD OF THE INVENTION

The present invention relates to the field of display technology, and in particular, relates to a gate driving unit and a driving method thereof, a gate driving circuit and a display device.

BACKGROUND OF THE INVENTION

In the prior art, a gate driving signal of a liquid crystal display (LCD) panel is provided by a driver IC, a gate on array (GOA) structure can be used to scan a gate, and a rectangular waveform is shifted by use of a multi level gate (MLG) function of a timing controller Tcon so as to be provided to a gate line of a display screen as a gate driving signal.

In the existing GOA structure, after a row of pixel units are scanned, a potential of the gate driving signal of the gate line of the row of pixel units is reversed, that is, jumps from a high potential to a low potential or from a low potential to a high potential. At the moment of the jumping, an output signal, which is applied by a gate driving circuit through the gate line to the pixel units corresponding thereto, will generate a voltage rise or a voltage drop, which further leads to a jump voltage of the pixel units that is in certain direct proportion to the gate voltage drop.

Accuracy and symmetry of a pixel voltage are crucial, and one of the important factors that influence the accuracy of the pixel voltage is the jump voltage generated by coupling the voltage drop of the output signal provided by the gate driving circuit to the pixel units. A large voltage drop of the output signal from the gate driving circuit must result in a large jump voltage of the pixel units. At present, a method adopted for reducing the gate voltage drop is to share charges by the peripheral driver IC circuit of an array substrate in time sequence, so as to achieve the effect of reducing the voltage, thereby reducing a value of the gate voltage drop under the premise of little effect on charging of the pixel units.

However, the aforesaid charge sharing manner is not applicable to the GOA structure, so that further study on a charge sharing structure for the GOA structure is needed.

SUMMARY OF THE INVENTION

In order to solve at least the aforesaid problem existing in the prior art, the embodiments of the present invention provide a gate driving unit and a driving method thereof, a gate driving circuit and a display device. The gate driving unit has a relatively small gate voltage drop, so as to guarantee a relatively small jump voltage of a pixel unit, thereby being capable of providing a pixel voltage having better accuracy and symmetry.

The embodiments of the present invention provide a gate driving unit used for providing a gate driving signal for a gate line, comprising a driving signal output unit and an output compensation unit, wherein the driving signal output unit and the output compensation unit are respectively connected to two input terminals of a load, and the output compensation unit is configured to compensate for level jumping of a gate driving signal outputted from the driving signal output unit.

The driving signal output unit may comprise an input module, a pull-down control module, a pull-down module, a reset module and an output module.

The input module is connected with a pull-up point and an input signal terminal, and is configured to pull up a voltage at the pull-up point to a high level, and the pull-up point is a connection point between the input module and the output module.

The output module is connected with the pull-up point, a first clock signal terminal, and a first input terminal of the load, and is configured to output a gate driving signal to the load under the control of a first clock signal and the pull-up point.

The pull-down control module is connected with a pull-down point and a second clock signal terminal, and is configured to preset a voltage at the pull-down point to a high level under the control of a second clock signal, and the pull-down point is a connection point between the pull-down control module and the pull-down module.

The pull-down module is connected with the input signal terminal, the pull-up point, the pull-down point, the second clock signal terminal, a reference voltage terminal and the output module, and is configured to pull down the voltage at the pull-up point to a low level and pull down a voltage at a point at which the output module is connected with the first input terminal of the load to a low level.

The reset module is connected with a reset signal terminal, the pull-up point, the pull-down point and the reference voltage terminal, and is configured to reset a signal of the pull-down module under the control of a reset signal.

The output compensation unit may be connected with a compensation control signal terminal, the reference voltage terminal, and a second input terminal of the load, and is configured to make the gate driving signal outputted from the input module to the load jump before level jumping of the first clock signal.

The input module may comprise a first transistor. A gate and a first electrode of the first transistor are respectively connected to the input signal terminal, and a second electrode of the first transistor is connected to the pull-up point.

The reset module may comprise a second transistor, a sixth transistor and an eleventh transistor. A gate of the second transistor is connected to the reset signal terminal, a first electrode of the second transistor is connected to the reference voltage terminal, and a second electrode of the second transistor is connected to the first input terminal of the load. A gate of the sixth transistor is connected to the reset signal terminal, a first electrode of the sixth transistor is connected to the pull-up point, and a second electrode of the sixth transistor is connected to the reference voltage terminal. A gate of the eleventh transistor is connected to the pull-up point, a first electrode of the eleventh transistor is connected to the pull-down point, and a second electrode of the eleventh transistor is connected to the reference voltage terminal.

The pull-down module may comprise a third transistor, a fifth transistor, a seventh transistor and a tenth transistor. A gate of the fifth transistor is connected to the second clock signal terminal, a first electrode of the fifth transistor is connected to the pull-up point, and a second electrode of the fifth transistor is connected to the input signal terminal. A gate of the third transistor is connected to the pull-down point, a first electrode of the third transistor is connected to the first input terminal of the load, and a second electrode of the third transistor is connected to the reference voltage terminal. A gate of the seventh transistor is connected to the pull-down point, a first electrode of the seventh transistor is connected to the reference voltage terminal, and a second electrode of the seventh transistor is connected to the pull-up point. A gate of the tenth transistor is connected to the second clock signal terminal, a first electrode of the tenth transistor is connected to the first input terminal of the load, and a second electrode of the tenth transistor is connected to the reference voltage terminal.

The output module may comprise a fourth transistor and a first capacitor. A gate of the fourth transistor is connected to the pull-up point, a first electrode of the fourth transistor is connected to the first clock signal terminal, and a second electrode of the fourth transistor is connected to the first input terminal of the load. A first terminal of the first capacitor is connected to the pull-up point, and a second terminal of the first capacitor is connected to the first input terminal of the load.

The pull-down control module may comprise a ninth transistor. A gate and a first electrode of the ninth transistor are respectively connected to the second clock signal terminal, and a second electrode of the ninth transistor is connected to the pull-down point.

The output compensation unit may comprise an eighth transistor. A gate of the eighth transistor is connected to the compensation control signal terminal, a first electrode of the eighth transistor is connected to the reference voltage terminal, and a second electrode of the eighth transistor is connected to the second input terminal of the load.

The embodiments of the present invention further provide a gate driving circuit, comprising the aforesaid gate driving units, wherein a plurality of said gate driving units are in cascade connection, and each gate driving unit provides a gate driving signal for one gate line.

The embodiments of the present invention further provide a display device, comprising the aforesaid gate driving circuit.

The embodiments of the present invention further provide a driving method of the aforesaid gate driving unit, comprising: an input stage of receiving, by an input module, an output signal from an output module of a gate driving unit of a previous row of gate line to serve as an input signal, and storing the input signal at a pull-up point; a pull-down control stage of presetting a voltage at a pull-down point in a pull-down control module to a high level, under the control of a second clock signal; a pull-down stage of pulling up a voltage at the pull-up point and a voltage of a first input terminal of a load, under the control of the second clock signal; a voltage output stage of outputting a gate driving signal to the load under the action of a first clock signal, and outputting a compensation signal for level jumping of gate driving signal to the load under the action of a compensation control signal; and a reset stage of resetting a pull-down module with an output signal from an output module of a gate driving unit of a next row of gate line as a reset signal, and pulling down the voltage at the pull-up point and the voltage of the first input terminal of the load.

The voltage output stage may include: an output holding stage of applying the voltage at the pull-up point to the first input terminal of the load to serve as the gate driving signal, under the action of the first clock signal; and an output compensation stage of making a voltage corresponding to the first clock signal and a voltage corresponding to the second clock signal share charges under the action of the compensation control signal, so as to reduce an output voltage and compensate for the gate driving signal.

A pulse frequency of the compensation control signal may be twice as much as a pulse frequency of the first clock signal. A rectangular pulse wave of the odd-numbered compensation control signal is ahead of the first clock signal and a falling edge of the rectangular pulse wave coincides with a falling edge of the first clock signal; and a rectangular pulse wave of the even-numbered compensation control signal is ahead of the first clock signal and a falling edge of the rectangular pulse wave coincides with a rising edge of the first clock signal.

Effective time of the rectangular pulse wave of the compensation control signal may range from 1 μs 3 μs.

The first clock signal and the second clock signal may be a pair of rectangular pulse waves having the same timing sequence and opposite phases, and duty ratio of the rectangular pulse wave is 50%.

In the gate driving unit and the corresponding gate driving method thereof in the embodiments of the present invention, a relatively small gate voltage drop is realized, so as to guarantee that a gate driving signal provided for a gate line has a relatively small jump voltage, thereby making the same row of pixel units connected with this gate line have a relatively small jump voltage, so that a pixel voltage having better accuracy and symmetry can be provided.

The gate driving circuit adopting the gate driving unit has good pixel unit charging performance, so that the display device adopting the gate driving circuit is low in cost and has higher image quality.

DETAILED DESCRIPTION OF THE EMBODIMENTS

In order to make those skilled in the art better understand the technical solutions of the present invention, a gate driving unit and a driving method thereof, a gate driving circuit and a display device in the present invention will be further described in detail below in conjunction with the accompanying drawings and specific implementations.

The embodiments of the present invention provide a gate driving unit and a corresponding driving method, which are used for providing a gate driving signal for a gate line. The gate driving unit comprises a driving signal output unit and an output compensation unit. The driving signal output unit and the output compensation unit are respectively connected to two input terminals of a load, and the output compensation unit is used to compensate for level jumping of a gate driving signal outputted from the driving signal output unit. With the gate driving unit and the corresponding driving method, an output voltage of the gate driving unit can be reduced before falling of a gate signal, so as to reduce a jump voltage of a pixel unit, thereby improving accuracy and symmetry of a pixel voltage.

The embodiments of the present invention provide a gate driving unit and a gate driving circuit comprising said gate driving unit. Besides effectively driving a gate line, the gate driving unit can also guarantee a relatively small jump voltage of a pixel unit, so as to improve accuracy and symmetry of a pixel voltage, thereby improving image quality of a display device.

Figure 1:
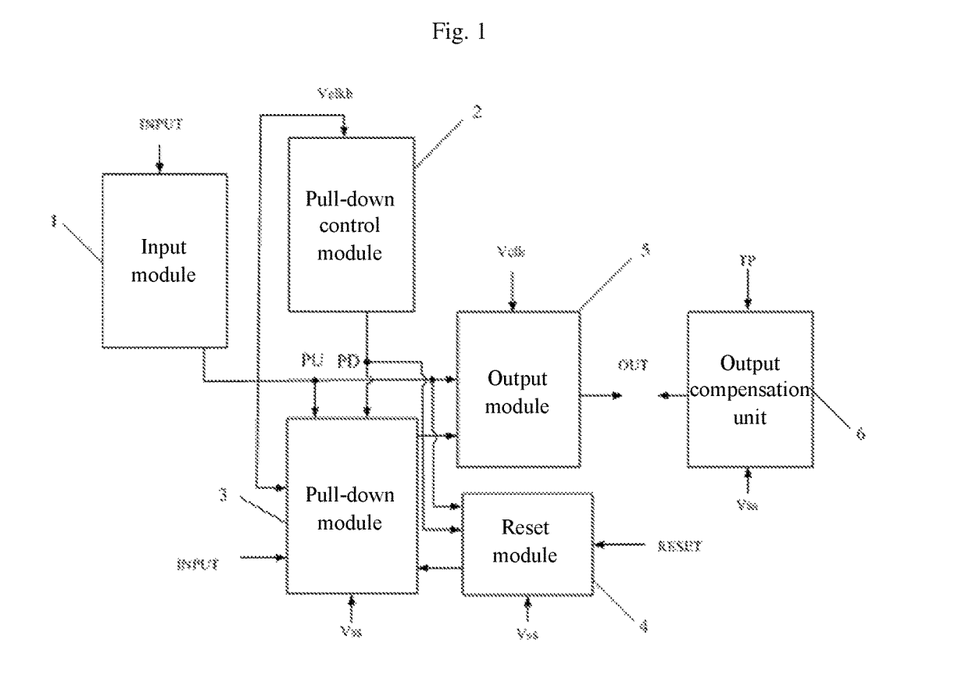
FIG. 1 is a block diagram of a gate driving unit according to an embodiment of the present invention.

As shown in FIG. 1, the gate driving unit comprises a driving signal output unit and an output compensation unit 6. The driving signal output unit comprises an input module 1, a pull-down control module 2, a pull-down module 3, a reset module 4 and an output module 5.

The input module 1 is connected with a pull-up point PU and an input signal terminal that provides an input signal INPUT, and is configured to pull up a voltage at the pull-up point PU to a high level, and the pull-up point is a connection point between the input module 1 and the output module 5.

The output module 5 is connected with the pull-up point PU, a first clock signal terminal that provides a first clock signal Vclk, and a first input terminal of a load, and is configured to output a gate driving signal to the load under the control of the first clock signal Vclk and the voltage of the pull-up point PU.

The pull-down control module 2 is connected with a pull-down point PD and a second clock signal terminal that provides a second clock signal Vclkb, and is configured to preset a voltage at the pull-down point PD to a high level under the control of the second clock signal Vclkb, and the pull-down point is a connection point between the pull-down control module 2 and the pull-down module 3.

The pull-down module 3 is connected with the input signal terminal, the pull-up point PU, the pull-down point PD, the second clock signal terminal, a reference voltage terminal that provides a reference voltage Vss generally falling within a range of −5V to 10V and the output module, and is configured to pull down the voltage at the pull-up point PU to a low level and pull down a voltage at a point at which the output module 5 is connected with the first input terminal of the load to a low level.

The reset module 4 is connected with a reset signal terminal that provides a reset signal RESET, the pull-up point PU, the pull-down point PD and the reference voltage terminal, and is configured to reset a signal of the pull-down module 3 under the control of the reset signal.

The output compensation unit 6 is connected with a compensation control signal terminal, the reference voltage terminal, and a second input terminal of the load, and is configured to make the gate driving signal outputted from the input module 1 to the load jump before level jumping of the first clock signal Vclk.

Figure 2:
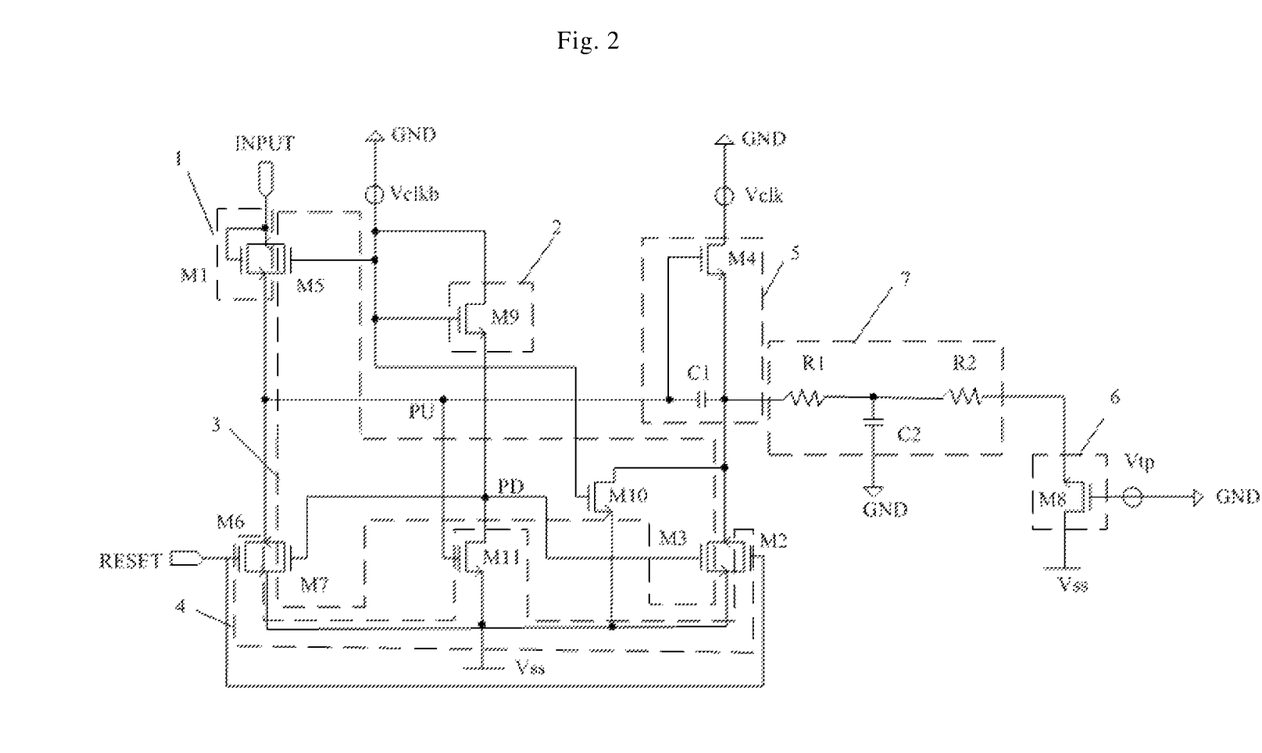
FIG. 2 is a circuit schematic diagram of a gate driving unit according to an embodiment of the present invention.

With reference to FIG. 2, the pull-up point PU is connected with a terminal, which is not directly connected with the load, of a first capacitor C1 in the output module 5. Specifically, the pull-up point PU is connected with a first terminal of the first capacitor C1, a second electrode of a first transistor M1, a first electrode of a fifth transistor M5, and a gate of an eleventh transistor M11. In addition, the pull-down point PD is connected with a gate of a third transistor M3, a gate of a seventh transistor M7, a second electrode of a ninth transistor M9, and a first electrode of the eleventh transistor M11.

Specifically, as shown in FIG. 2, the input module 1 comprises the first transistor M1. A gate and a first electrode of the first transistor M1 are respectively connected to the input signal terminal, and the second electrode of the first transistor M1 is connected to the pull-up point PU.

The output module 5 comprises a fourth transistor M4 and the first capacitor C1. A gate of the fourth transistor M4 is connected to the pull-up point PU, a first electrode of the fourth transistor M4 is connected to the first clock signal terminal, and a second electrode of the fourth transistor M4 is connected to the first input terminal of the load (that is, a second terminal of the first capacitor C1). The first terminal of the first capacitor C1 is connected to the pull-up point PU, and a second terminal of the first capacitor C1 (that is, one port of the output terminal of the gate driving unit) is connected to the first input terminal of the load.

The pull-down control module 2 comprises the ninth transistor M9. A gate and a first electrode of the ninth transistor M9 are respectively connected to the second clock signal terminal, and the second electrode of the ninth transistor M9 is connected to the pull-down point PD, that is, said second electrode is connected with the pull-down module 3.

The pull-down module 3 comprises a third transistor M3, the fifth transistor M5, the seventh transistor M7 and a tenth transistor M10.

A gate of the fifth transistor M5 is connected to the second clock signal terminal, the first electrode of the fifth transistor M5 is connected to the pull-up point PU, and a second electrode of the fifth transistor M5 is connected to the input signal terminal. In some embodiments, the first electrode and the second electrode of the first transistor M1 are connected to the second electrode and the first electrode of the fifth transistor M5 respectively, and share the input signal INPUT. In other embodiments, the first transistor M1 and the fifth transistor M5 can be, independent of each other, applied with the input signal INPUT.

The gate of the third transistor M3 is connected to the pull-down point PD, a first electrode of the third transistor M3 is connected to the first input terminal of the load (the second terminal of the first capacitor), and a second electrode of the third transistor M3 is connected to the reference voltage terminal.

The gate of the seventh transistor M7 is connected to the pull-down point PD, a first electrode of the seventh transistor M7 is connected to the reference voltage terminal (similar to the connection of the second electrode of the third transistor M3), and a second electrode of the seventh transistor M7 is connected to the pull-up point PU.

A gate of the tenth transistor M10 is connected to the second clock signal terminal, a first electrode of the tenth transistor M10 is connected to the first input terminal of the load (the second terminal of the first capacitor C1), and a second electrode of the tenth transistor M10 is connected to the reference voltage terminal.

The reset module 4 comprises a second transistor M2, a sixth transistor M6 and the eleventh transistor M11.

A gate of the second transistor M2 is connected to the reset signal terminal, a first electrode of the second transistor M2 is connected to the reference voltage terminal, and a second electrode of the second transistor M2 is connected to the first input terminal of the load (the first electrode of the third transistor M3 and the second terminal of the first capacitor C1).

A gate of the sixth transistor M6 is connected to the reset signal terminal, a first electrode of the sixth transistor M6 is connected to the pull-up point PU, and a second electrode of the sixth transistor M6 is connected to the reference voltage terminal.

The gate of the eleventh transistor M11 is connected to the pull-up point PU, the first electrode of the eleventh transistor M11 is connected to the pull-down point PD, and a second electrode of the eleventh transistor M11 is connected to the reference voltage terminal.

The output compensation unit 6 comprises an eighth transistor M8. A gate of the eighth transistor M8 is connected to the compensation control signal terminal that provides a compensation control signal Vtp, a first electrode of the eighth transistor M8 is connected to the reference voltage terminal, and a second electrode of the eighth transistor M8 is connected to the second input terminal of the load (that is, the second electrode of the eighth transistor M8 is not connected with the output module 5, but is connected with the other port of the output terminal of the gate driving unit, which is opposite to the one port of the output terminal).

In the gate driving unit in the embodiments of the present invention, the two ports of the output terminal cooperate with each other to provide the gate line with the gate driving signal, that is, the output signal OUT. By adding the compensation control signal Vtp and the output compensation unit, voltage sharing of the gate signal can be achieved. The compensation control signal Vtp is active-high. When the compensation control signal Vtp has a high level, the eighth transistor M8 is turned on, the first input terminal and the second input terminal of the load short-circuit instantaneously, so that the first clock signal Vclk and the second clock signal Vclkb short-circuit in a short time (Vclk and Vclkb share charges) at the edge(s) of the first clock signal Vclk and/or the second clock signal Vclkb, the high level of the gate signal neutralizes the low level of the gate signal, and a slope is formed at the rising edge or the falling edge of the output signal OUT (the shorter the rising time or the falling time is, the better), which avoids a gate voltage rise generated when the output signal of the output terminal of the gate driving unit jumps directly from a low level to a high level or a gate voltage drop generated when the output signal jumps directly from a high level to a low level, so as to make the same row of pixel units connected with the gate line have a relatively small jump voltage, so that a pixel voltage having better accuracy and symmetry can be provided.

In the embodiments of the present invention, the load 7 is an equivalent circuit of a row of pixel units connected to the same gate line in an LCD panel. R1, R2 and C2 in the load 7 form an equivalent circuit of the sum of circuits in all pixel units connected with the same gate line and liquid crystals in a display substrate.

All of the transistors in the embodiments of the present invention may be thin film transistors, or field-effect transistors, or other devices having similar characteristics. Since the source and the drain of the employed transistor are symmetrical, there is no difference between the source and the drain. In the embodiments of the present invention, in order to differentiate between the two electrodes of the transistor other than the gate, the first electrode may be the source, and the second electrode may be the drain. In addition, the transistors can be classified into N-type transistors or P-type transistors according to the characteristics of the transistors. In the gate driving unit provided in the embodiments of the present invention, description is given by taking a case that all the transistors are N-type transistors as an example. It is conceivable that those skilled in the art can readily envisage replacing N-type transistors with P-type transistors, without involving any inventive work, so that P-type transistors also fall into the protection scope of the present invention. In some embodiments, all of the first transistor M1 to the eleventh transistor M11 are P-type transistors. In other embodiments, all of the first transistor M1 to the eleventh transistor M11 are N-type transistors. In other embodiments, some of the first transistor M1 to the eleventh transistor M11 are P-type transistors, and others are N-type transistors, as long as terminals of the transistors are in right connection correspondingly.

Correspondingly, the embodiments of the present invention further provide a gate driving circuit, comprising the aforesaid gate driving units, wherein a plurality of said gate driving units are in cascade connection, and each gate driving unit provides a gate driving signal for one gate line. In said gate driving circuit, with regard to a certain gate driving unit, an output signal from an output module of a gate driving unit in a previous stage is applied to an input module of said certain gate driving unit, and an output signal from an output module of a gate driving unit in the next stage is applied to a reset module of said certain gate driving unit.

The gate driving unit and the corresponding gate driving circuit in the embodiments of the present invention have a relatively small gate voltage drop to guarantee that a gate driving signal provided for a gate line has a relatively small jump voltage, so as to make the same row of pixel units connected with said gate line have a relatively small jump voltage, thereby being capable of providing a pixel voltage having better accuracy and symmetry.

The embodiments of the present invention further provide a driving method of the aforesaid gate driving unit.

The driving method comprises an input stage, a pull-down control stage, a pull-down stage, a voltage output stage and a reset stage.

In the input stage, an input module receives an output signal from an output module of a gate driving unit of a previous row of gate line to serve as an input signal, and the input signal is stored at a pull-up point PU. Suppose that the gate driving unit is arranged to provide the gate driving signal for the $n^{th}$ row of gate line, the input signal INPUT is the output signal from the output module of the $(n-1)^{th}$ row of gate driving unit. The output signal is applied to the first transistor M1 of the $N^{th}$ row of gate driving unit, and is stored at the first terminal of the first capacitor C1 (the left terminal of the first capacitor C1 in FIG. 2). The input signal INPUT is active-high. When the output signal from the output module of the $(n-1)^{th}$ row of gate driving unit is active, the first capacitor C1 in the output module of the $(n-1)^{th}$ row of gate driving unit is charged; when the voltage of the output module of the $(n-1)^{th}$ row of gate driving unit has a low level, the first transistor M1 is turned off, and the voltage of the first capacitor C1 is not influenced. When the output module of the $n^{th}$ row of gate driving unit outputs a signal, the first clock signal Vclk is applied to the source and the drain of the fourth transistor M4, and the second terminal of the first capacitor C1 (the right terminal of the first capacitor C1 in FIG. 2) is coupled to the first terminal of the first capacitor C1, so as to increase the voltage at the first terminal of the first capacitor C1.

In this stage, the input signal INPUT and the first clock signal Vclk have high levels, the second clock signal Vclkb has a low level, the first transistor M1 is turned on, and the first terminal of the first capacitor C1 is charged to have a high level; meanwhile, under the effect of high level of the first terminal of the first capacitor C1, the fourth transistor M4 and the eleventh transistor M11 are turned on, the pull-up point PU and the first input terminal of the load are pulled down by the reference voltage Vss, and output of the output signal OUT has a low level.

In the pull-down control stage, under the control of the second clock signal Vclkb, the voltage at the pull-down point PD in the pull-down control module is preset to a high level.

In this stage, the second clock signal Vclkb has a high level, the input signal INPUT and the first clock signal Vclk have low levels, the input signal INPUT is the output signal from the output module of the $(n-1)^{th}$ row of gate driving unit, and the output signal is applied to the fifth transistor M5 of the $n^{th}$ row of gate driving unit. Since the gate and the source of a ninth transistor M9 are applied with the second clock signal Vclkb that has a high level, the ninth transistor M9 is turned on, the drain of the ninth transistor M9 also has a high level (that is, the voltage at the pull-down point PD is preset to a high level), the third transistor M3 and the seventh transistor M7 are turned on, and the voltage at the first terminal of the first capacitor C1 and the voltage at the second terminal of the first capacitor C1 are both pulled down.

In the pull-down stage, the gate of the third transistor M3 and the gate of the seventh transistor M7 in the pull-down module are both connected with the drain of the ninth transistor M9, a source of the third transistor M3 and a source of the seventh transistor M7 are connected to the first terminal and the second terminal of the first capacitor C1 respectively, and a drain of the third transistor M3 and a drain of the seventh transistor M7 are both connected to the reference voltage Vss, so that when the voltage (INPUT) of the previous row of gate line has a high level, the voltage at the pull-up point PU and the voltage at the first input terminal of the load are pulled up (that is, the voltage at the first terminal and the voltage at the second terminal of the first capacitor C1 are pulled up) under the control of the second clock signal Vclkb.

The voltage output stage includes an output holding stage and an output compensation stage. In the output holding stage, under the action of the first clock signal Vclk, the voltage at the pull-up point PU is applied to the first input terminal of the load (that is, the voltage at the first terminal of the first capacitor C1 is outputted to the load through the second terminal of the first capacitor C1) so as to serve as a gate driving signal. In the output compensation stage, under the action of a compensation control signal, the first clock signal Vclk and the second clock signal Vclkb short-circuit, and an output voltage is reduced, thereby compensating for the gate driving signal.

In the output holding stage, the gate of the tenth transistor M10 is applied with the second clock signal Vclkb, the source of the tenth transistor M10 is connected to the reference voltage Vss, and the drain of the tenth transistor M10 is connected to the second terminal of the first capacitor C1. When the second clock signal Vclkb has a high level, the reference voltage Vss is inputted to the second terminal of the first capacitor C1 through the drain of the tenth transistor M10, so as to keep the driving signal of the gate line Gate stable, that is, keep the voltage fluctuation of the waveform of the gate line Gate in the holding stage and make the circuit voltage stable. Under the action of the first clock signal Vclk, the voltage at the pull-up point PU is inputted to the first input terminal of the load.

Meanwhile, the gate of the eighth transistor M8 is applied with the compensation control signal Vtp, the source of the eighth transistor M8 is connected to the reference voltage Vss, the drain of the eighth transistor M8 is connected to the second input terminal of the load, the compensation control signal Vtp is a function control signal, a timing sequence of the compensation control signal Vtp is provided by a timing control circuit, and effective time of a rectangular pulse wave of the compensation control signal Vtp may fall within a range of 1-3 µs. In the output compensation stage, according to the timing sequence, when the compensation control signal Vtp has a high level, under the control of the compensation control signal Vtp, the eighth transistor M8 is turned on, the first clock signal Vclk and the second clock signal Vclkb short-circuit, the voltage of the gate driving signal will decrease to be equal to an average value of a gate signal low level and a gate signal high level, and the voltage of the output signal OUT decreases, so as to reduce an amplitude of a gate voltage drop generated when a waveform outputted from the output terminal of the gate driving unit jumps from a rising edge to a falling edge.

In this embodiment, the first clock signal Vclk and the second clock signal Vclkb are a pair of rectangular pulse waves having the same timing sequence and opposite phases, and duty ratio of the rectangular pulse wave is 50%. A pulse frequency of the compensation control signal is twice as much as a pulse frequency of the first clock signal Vclk. A rectangular pulse wave of the odd-numbered compensation control signal is ahead of the first clock signal Vclk and a falling edge of the rectangular pulse wave coincides with a falling edge of the first clock signal Vclk, and a rectangular pulse wave of the even-numbered compensation control signal is ahead of the first clock signal Vclk and a falling edge of the rectangular pulse wave coincides with a rising edge of the first clock signal Vclk, so as to guarantee symmetry of the pixel voltage. When the compensation control signal Vtp is active-high, the first input terminal and the second input terminal of the load short-circuit instantaneously, so that the first clock signal Vclk and the second clock signal Vclkb short-circuit in a short time (Vclk and Vclkb share charges) at the edges of the first clock signal Vclk and the second clock signal Vclkb, the high level of the gate signal neutralizes the low level of the gate signal, a slope is formed at the rising edge or the falling edge of the output signal OUT (the shorter the rising time or the falling time is, the better), which avoids a gate voltage rise generated when the output signal of the output terminal of the gate driving unit jumps directly from a low level to a high level or a gate voltage drop generated when the output signal jumps directly from a high level to a low level.

Figure 3:
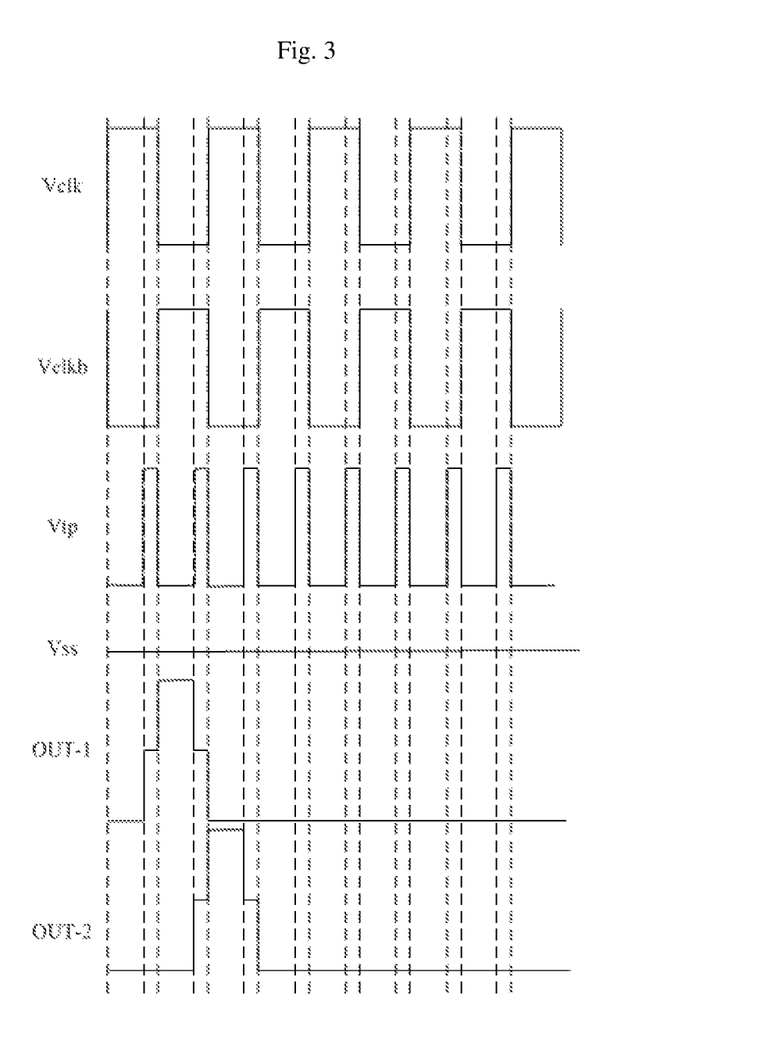
FIG. 3 is a timing diagram of a gate driving unit according to an embodiment of the present invention.
Figure 4:
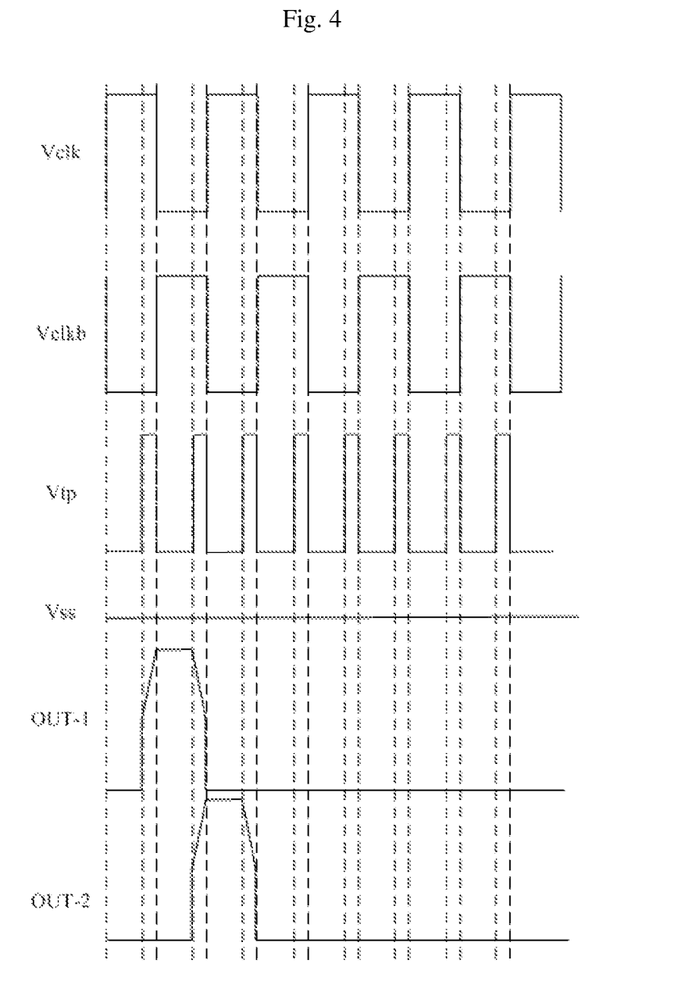
FIG. 4 is a timing diagram of a gate driving unit according to an embodiment of the present invention.

It can be seen that, based on the same working principles, when the voltage of the output terminal OUT changes from a low level to a high level, the rising edge rises in advance, so as to reduce the value of the gate voltage rise; and when the voltage of the output terminal OUT changes from a high level to a low level, the falling edge falls in advance, so as to reduce the value of the gate voltage drop. In FIGS. 3 and 4, an output voltage OUT-1 serves as a driving signal for the $N^{th}$ row of gate line, and an output voltage OUT-2 serves as a driving signal for the $(N+1)^{th}$ row of gate line. Since OUT-1 and OUT-2 rise to a high level in advance in the form of a rising slope at the rising edges, and fall to a low level in advance in the form of a falling slope at the falling edges, the component in vertical direction of the driving signal of the gate line during jumping in this embodiment is reduced compared to a rectangular pulse waveform, so that the jump voltage of the pixel unit can be reduced effectively. Ideally, in some embodiments, the rising edge of the gate driving voltage forms into a shape of gradually rising steps, and the falling edge of the gate driving voltage forms into a shape of gradually declining steps (as shown in FIG. 3). Actually, in other embodiments, the rising edges of the gate driving voltages OUT-1 and OUT-2 form into a shape of gradually rising slope, and the falling edges form into a shape of gradually declining slope (as shown in FIG. 4).

In the reset stage, a pull-down module is reset by using the output signal from the output module of the gate driving unit corresponding to the next row of gate line as a reset signal, and the voltage at the pull-up point PU and the voltage of the first input terminal of the load (that is, the voltage of the first terminal and the voltage of the second terminal of the first capacitor) are pulled down. The source of the sixth transistor M6 is connected to the first terminal of the first capacitor C1, and the drain of the sixth transistor M6 is connected to the reference voltage Vss. The source of the second transistor M2 is connected to the second terminal of the first capacitor C1, and the drain of the second transistor M2 is connected to the reference voltage Vss. The reset signal RESET is an output from the $(N+1)^{th}$ row of gate line, when the reset signal RESET has a high level, the sixth transistor M6 and the second transistor M2 are turned on, and the first capacitor C1 is reset to have a low level, so as to wait for scanning this row of gate line for the next frame. Meanwhile, the gate of an eleventh transistor M11 is connected to the first terminal of the first capacitor C1, the source of the eleventh transistor M11 is connected to the drain of the ninth transistor M9, and the drain of the eleventh transistor M11 is connected to the reference voltage Vss. When the $(N+1)^{th}$ row of gate line Gate N−1 and the $N^{th}$ row of gate line Gate N output at the same time, the eleventh transistor M11 is turned on and a voltage of the drain of the ninth transistor M9 is pulled down.

By employing the driving method of the gate driving unit in this embodiment, a relatively small gate voltage drop can be achieved so as to guarantee that the gate driving signal provided for a gate line has a relatively small jump voltage, thereby making the same row of pixel units connected with the gate line have a relatively small jump voltage, so that a more accurate pixel voltage can be provided.

The embodiments of the present invention further provide a display device, comprising the aforesaid gate driving unit and the corresponding gate driving circuit.

The display device may be any product or component having a display function, such as a liquid crystal panel, electronic paper, a mobile phone, a tablet computer, a TV set, a display, a notebook computer, a digital photo frame, or a navigator.

Since the gate driving unit and the corresponding gate driving circuit have good pixel unit charging performance, the display device adopting the same is low in cost and has higher image quality.

It should be understood that the foregoing implementations are merely exemplary implementations adopted for describing the principle of the present invention, but the present invention is not limited thereto. Those of ordinary skill in the art may make various variations and improvements without departing from the spirit and essence of the present invention, and these variations and improvements shall be considered to fall into the protection scope of the present invention.

What is claimed is:

1. A driving method of a gate driving unit for providing a gate driving signal for a gate line, comprising a driving signal output unit and an output compensation unit, wherein the driving signal output unit and the output compensation unit are respectively connected to two input terminals of a load, and the output compensation unit is configured to compensate for level jumping of the gate driving signal outputted from the driving signal output unit,
the driving method comprises:

an input stage of receiving, by an input module, an output signal from an output module of a gate driving unit of a previous row of gate line to serve as an input signal, and storing the input signal at a pull-up point;

a pull-down control stage of presetting a voltage at a pull-down point in a pull-down control module to a high level, under the control of a second clock signal;

a pull-down stage of pulling up a voltage at the pull-up point and a voltage of a first input terminal of a load, under the control of the second clock signal;

a voltage output stage of outputting the gate driving signal to the load under the action of a first clock signal, and outputting a compensation signal for level jumping of gate driving signal to the load under the action of a compensation control signal; and a reset stage of resetting a pull-down module with an output signal from an output module of a gate driving unit of a next row of gate line as a reset signal, and pulling down the voltage at the pull-up point and the voltage of the first input terminal of the load, wherein a pulse frequency of the compensation control signal is twice as much as a pulse frequency of the first clock signal; and a rectangular pulse wave of an odd-numbered compensation control signal is ahead of the first clock signal and a falling edge of the rectangular pulse wave coincides with a falling edge of the first clock signal; and a rectangular pulse wave of an even-numbered compensation control signal is ahead of the first clock signal and a falling edge of the rectangular pulse wave coincides with a rising edge of the first clock signal.

2. The driving method of claim 1, wherein the voltage output stage includes:

an output holding stage of applying the voltage at the pull-up point to the first input terminal of the load to serve as the gate driving signal, under the action of the first clock signal; and an output compensation stage of making a voltage corresponding to the first clock signal and a voltage corresponding to the second clock signal share charges under the action of the compensation control signal, so as to reduce an output voltage and compensate for the gate driving signal.

3. The driving method of claim 1, wherein effective time of the rectangular pulse wave of the compensation control signal ranges from 1 μs to 3 μs.

4. The driving method of claim 1, wherein the first clock signal and the second clock signal are a pair of rectangular pulse waves having a same timing sequence and opposite phases, and duty ratio of the rectangular pulse wave is 50%.

5. The driving method of claim 1, wherein the driving signal output unit comprises an input module, the pull-down control module, a pull-down module, a reset module and an output module, wherein the input module is connected with the pull-up point and an input signal terminal, and is configured to pull up the voltage at the pull-up point to a high level, and the pull-up point is a connection point between the input module and the output module;

the output module is connected with the pull-up point, the first clock signal terminal, and the first input terminal of the load, and is configured to output the gate driving signal to the load under the control of the first clock signal and the pull-up point;

the pull-down control module is connected with the pull-down point and a second clock signal terminal, and is configured to preset the voltage at the pull-down point to the high level under the control of the second clock signal, and the pull-down point is a connection point between the pull-down control module and the pull-down module;

the pull-down module is connected with the input signal terminal, the pull-up point, the pull-down point, the second clock signal terminal, a reference voltage terminal and the output module, and is configured to pull down the voltage at the pull-up point to a low level and pull down a voltage at a point at which the output module is connected with the first input terminal of the load to a low level; and the reset module is connected with a reset signal terminal, the pull-up point, the pull-down point and the reference voltage terminal, and is configured to reset a signal of the pull-down module under the control of a reset signal.

6. The driving method of claim 5, wherein the output compensation unit is connected with the compensation control signal terminal, the reference voltage terminal, and a second input terminal of the load, and is configured to make the gate driving signal outputted from the input module to the load jump before level jumping of the first clock signal.

7. The driving method of claim 5, wherein the input module comprises a first transistor, wherein a gate and a first electrode of the first transistor are respectively connected to the input signal terminal, and a second electrode of the first transistor is connected to the pull-up point.

8. The driving method of claim 5, wherein the reset module comprises a second transistor, a sixth transistor and an eleventh transistor, wherein a gate of the second transistor is connected to the reset signal terminal, a first electrode of the second transistor is connected to the reference voltage terminal, and a second electrode of the second transistor is connected to the first input terminal of the load;

a gate of the sixth transistor is connected to the reset signal terminal, a first electrode of the sixth transistor is connected to the pull-up point, and a second electrode of the sixth transistor is connected to the reference voltage terminal; and a gate of the eleventh transistor is connected to the pull-up point, a first electrode of the eleventh transistor is connected to the pull-down point, and a second electrode of the eleventh transistor is connected to the reference voltage terminal.

9. The driving method of claim 5, wherein the pull-down module comprises a third transistor, a fifth transistor, a seventh transistor and a tenth transistor, wherein a gate of the fifth transistor is connected to the second clock signal terminal, a first electrode of the fifth transistor is connected to the pull-up point, and a second electrode of the fifth transistor is connected to the input signal terminal;

a gate of the third transistor is connected to the pull-down point, a first electrode of the third transistor is connected to the first input terminal of the load, and a second electrode of the third transistor is connected to the reference voltage terminal;

a gate of the seventh transistor is connected to the pull-down point, a first electrode of the seventh transistor is connected to the reference voltage terminal, and a second electrode of the seventh transistor is connected to the pull-up point; and a gate of the tenth transistor is connected to the second clock signal terminal, a first electrode of the tenth transistor is connected to the first input terminal of the load, and a second electrode of the tenth transistor is connected to the reference voltage terminal.

10. The driving method of claim 5, wherein the output module comprises a fourth transistor and a first capacitor, wherein a gate of the fourth transistor is connected to the pull-up point, a first electrode of the fourth transistor is connected to the first clock signal terminal, and a second electrode of the fourth transistor is connected to the first input terminal of the load; and a first terminal of the first capacitor is connected to the pull-up point, and a second terminal of the first capacitor is connected to the first input terminal of the load.

11. The driving method of claim 5, wherein the pull-down control module comprises a ninth transistor, wherein a gate and a first electrode of the ninth transistor are respectively connected to the second clock signal terminal, and a second electrode of the ninth transistor is connected to the pull-down point.

12. The driving method of claim 6, wherein the output compensation unit comprises an eighth transistor, wherein a gate of the eighth transistor is connected to the compensation control signal terminal, a first electrode of the eighth transistor is connected to the reference voltage terminal, and a second electrode of the eighth transistor is connected to the second input terminal of the load.

\* \* \* \* \*